United States Patent
Murakawa et al.

(10) Patent No.: US 6,667,632 B2
(45) Date of Patent: Dec. 23, 2003

(54) POTENTIAL SENSOR FOR DETECTING VOLTAGE OF INSPECTION TARGET AT NON-CONTACT CONDITION TO ATTAIN HIGHER SPEED OF INSPECTION

(75) Inventors: Shinichi Murakawa, Hyogo-ken (JP); Soumyo Doi, Hyogo-ken (JP); Yoshio Egashira, Hyogo-ken (JP); Tadashi Rokkaku, Shiga-ken (JP); Shigeo Ueda, Shiga-ken (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 33 days.

(21) Appl. No.: 09/840,129

(22) Filed: Apr. 24, 2001

(65) Prior Publication Data

US 2002/0153919 A1 Oct. 24, 2002

(51) Int. Cl.[7] .................................................. G01R 1/04
(52) U.S. Cl. ....................................................... 324/770
(58) Field of Search ................................... 324/770, 765, 324/158.1; 327/377, 429; 340/636; 345/87, 90

(56) References Cited

U.S. PATENT DOCUMENTS 3,740,581 A * 6/1973 Pfiffner ...................... 327/377
3,889,133 A * 6/1975 Oka et al. ................... 327/429
4,173,756 A * 11/1979 Kawagai et al. ............ 340/636
5,428,300 A * 6/1995 Takahashi et al. .......... 324/770

FOREIGN PATENT DOCUMENTS

| JP | 64-35597 | 2/1989 |
|---|---|---|
| JP | 1-210872 | 8/1989 |
| JP | 5-11000 | 1/1993 |
| JP | 10-62474 | 3/1998 |
| JP | 10-104563 | 4/1998 |

* cited by examiner

*Primary Examiner*—Vinh P. Nguyen
(74) *Attorney, Agent, or Firm*—Oblon, Spivak, McClelland, Maier & Neustadt, P.C.

(57) ABSTRACT

A potential sensor, includes a field effect transistor, a power supply and a switching device. The power supply supplies a direct current voltage to a gate electrode of the field effect transistor. The switching device switches between connecting the gate electrode to the power supply and disconnecting the gate electrode from the power supply. When the gate electrode is connected to the power supply, the field effect transistor is in action. When the gate electrode is disconnected from the power supply, the field effect transistor is in action.

25 Claims, 4 Drawing Sheets

US 6,667,632 B2

POTENTIAL SENSOR FOR DETECTING VOLTAGE OF INSPECTION TARGET AT NON-CONTACT CONDITION TO ATTAIN HIGHER SPEED OF INSPECTION

BACKGROUND OF THE INVENTION

1. Field of the Invention

The present invention relates to a potential sensor for inspecting a liquid crystal panel used in a television, a personal computer or the like.

2. Description of the Related Art

Typically, as a method for evaluating a liquid crystal panel, there are an operation test, a reliability test, an appearance test and the like. The above-mentioned inspection of the liquid crystal panel is mainly carried out as a lighting operation check test after a product is assembled. The higher speed of the inspection is required in conjunction with the larger size and the higher accuracy of the liquid crystal panel.

FIG. 1 is a view showing a conventional method for inspecting a liquid crystal panel. Traditionally, as the method for inspecting the liquid crystal panel, for example, a probe method is employed which makes respective probes 32, 31 come into contact with a gate voltage wiring 33 and a source voltage wiring 35 that are connected to a TFT transistor 30, as shown in FIG. 1, and then inspects a disconnection, a short-circuit or the like of a pixel electrode 2 based on its output voltage. This inspecting method detects a defect of the pixel electrode 2 of a liquid crystal panel 9 by applying an inspection signal to the source voltage wiring 35 and the gate voltage wiring 33 of the liquid crystal panel 9.

However, the above inspecting method has the problems, such as an increase in a contact error or an increase in a maintenance cost of the probes 32, 31. Moreover, a larger amount of display information requires a larger size, a full color and a higher minuteness of a liquid crystal display, which results in the problem of the higher speed of the inspection.

Japanese Laid Open Patent Application (JP-A-Heisei, 5-11000) discloses an active matrix array inspection apparatus as described below. The active matrix array inspection apparatus is provided with: a gate signal generator; a source signal generator; a gate signal line selector for selectively switching and connecting each gate signal line of an active matrix array to be inspected, to any of an output terminal, an open terminal and a ground terminal of the gate signal generator; a source signal line selector for selectively switching and connecting each source signal line of the active matrix array to be inspected, to any of an output terminal, an open terminal and a ground terminal of the source signal generator; a non-contact probe for detecting an electric condition of a drain terminal of a thin film transistor connected to the gate signal line and the source signal line at a non-contact condition; and a judging device for judging the acceptance or rejection of the thin film transistor on the basis of the detection output from the non-contact probe.

SUMMARY OF THE INVENTION

The present invention is accomplished in view of the above mentioned problems. Therefore, an object of the present invention is to provide a potential sensor for detecting a voltage of an inspection target at a non-contact condition to attain a higher speed of an inspection.

In order to achieve an aspect of the present invention, a potential sensor, includes: a field effect transistor; a power supply supplying a direct current voltage to a gate electrode of the field effect transistor; and a switching device switching between connecting the gate electrode to the power supply and disconnecting the gate electrode from the power supply, and wherein when the gate electrode connected to the power supply, the field effect transistor is in action, and when the gate electrode is disconnected from the power supply, the field effect transistor is in action.

In this case, when the gate electrode is disconnected from the power supply, the field effect transistor is in action with a charge included in an oxide film under the gate electrode.

Also in this case, the charge is charged in the oxide film when the gate electrode is connected to the power supply.

Further in this case, wherein when the potential sensor is used, the gate electrode is coupled through an air-gap to an inspection target.

In this case, a voltage is applied to the inspection target.

Also in this case, the air-gap has an interval of approximately 20 µm.

Further in this case, when the gate electrode is connected to the power supply, the voltage applied to the inspection target is applied to the switching device not to be outputted in a source electrode of the field effect transistor.

In this case, when the gate electrode is disconnected from the power supply, the voltage applied to the inspection target is outputted in a source electrode of the field effect transistor not to be applied to the switching device.

Also in this case, the field effect transistor is an enhancement type MOS-FET.

In order to achieve another aspect of the present invention, a potential sensing method, includes: (a) providing a field effect transistor; (b) providing a power supply supplying a direct current voltage to a gate electrode of the field effect transistor; (c) providing a switching device switching between connecting the gate electrode to the power supply and disconnecting the gate electrode from the power supply; (d) applying a voltage to an inspection target; (e) coupling the gate electrode through an air-gap to the inspection target; (f) connecting the gate electrode to the power supply; (g) disconnecting the gate electrode from the power supply after the (f); and (h) outputting the voltage applied to the inspection target from a source electrode of the field effect transistor while the (g) is performed.

In this cases the (f), (g) and (h) are performed repeatedly.

Also in this case, when each of the (f) and (g) is performed, the field effect transistor is in action.

Further in this case, when the (f) is performed, a charge from the power supply is charged in an oxide film under the gate electrode.

In this case, the when the (g) is performed, the field effect transistor is in action with the charge included in the oxide film.

Also in this case, the (e) includes setting the air-gap to have an interval of approximately 20 µm.

Further in this case, when the (f) is performed, the voltage applied to the inspection target is applied to the switching device not to be outputted from the source electrode.

In this case, when the (g) is performed, the voltage applied to the inspection target is not applied to the switching device.

Also in this case, the inspection target is a pixel electrode of a liquid crystal panel.

Further in this case, the field effect transistor is an enhancement type MOS-FET.

In this case, the (h) is performed in a condition that the gate electrode is not in mechanical contact with the inspection target.

DESCRIPTION OF THE PREFERRED EMBODIMENT

An embodiment of a potential sensor in the present invention will be described below in detail with reference to the attached drawings.

It should be noted that there is a copending U.S. patent application Ser. No. 09/789,543, entitled "Apparatus and method for testing electrode structure for thin display device using FET function", claiming a priority based on Japanese patent application No. Heisei 10-225968, invented by Shinichi Murakawa, Takashi Doi, Yoshio Egashira and Shigeo Ueda who are four inventors other than Tadashi Rokkaku of five inventors of the present application, and assigned to an assignee who is an assignee of the patent application. The content of the copending U.S. application is incorporated herein by reference.

Figure 1:
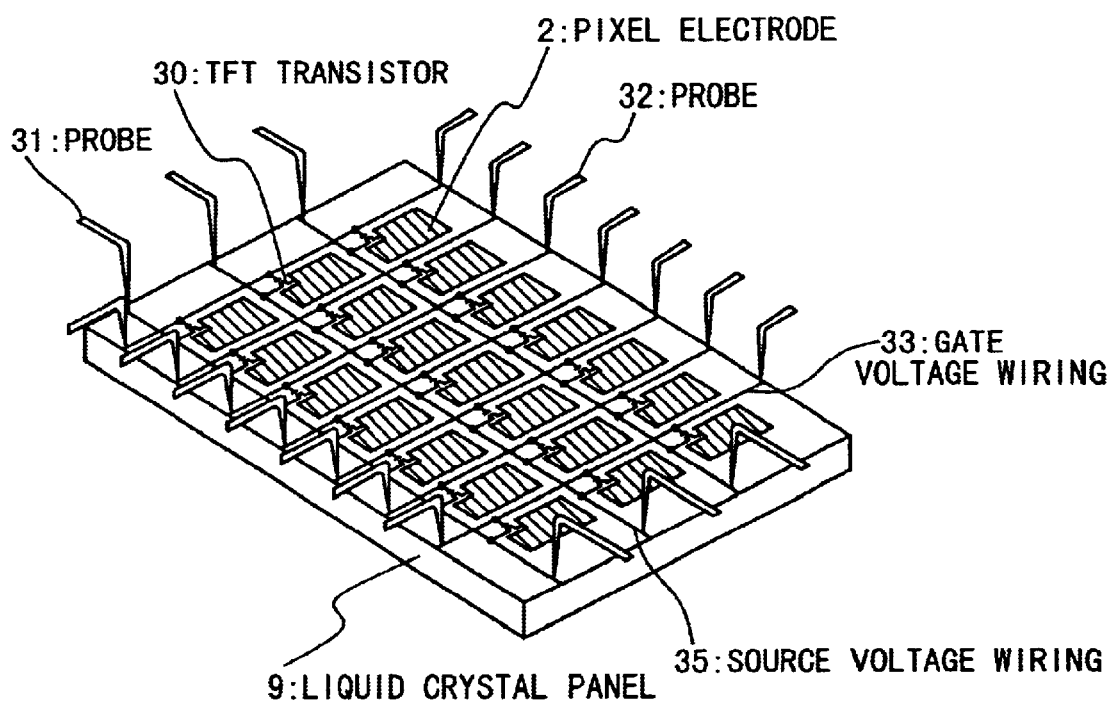
FIG. 1 is a view showing a method for inspecting a liquid crystal panel according to a conventional example.
Figure 2:
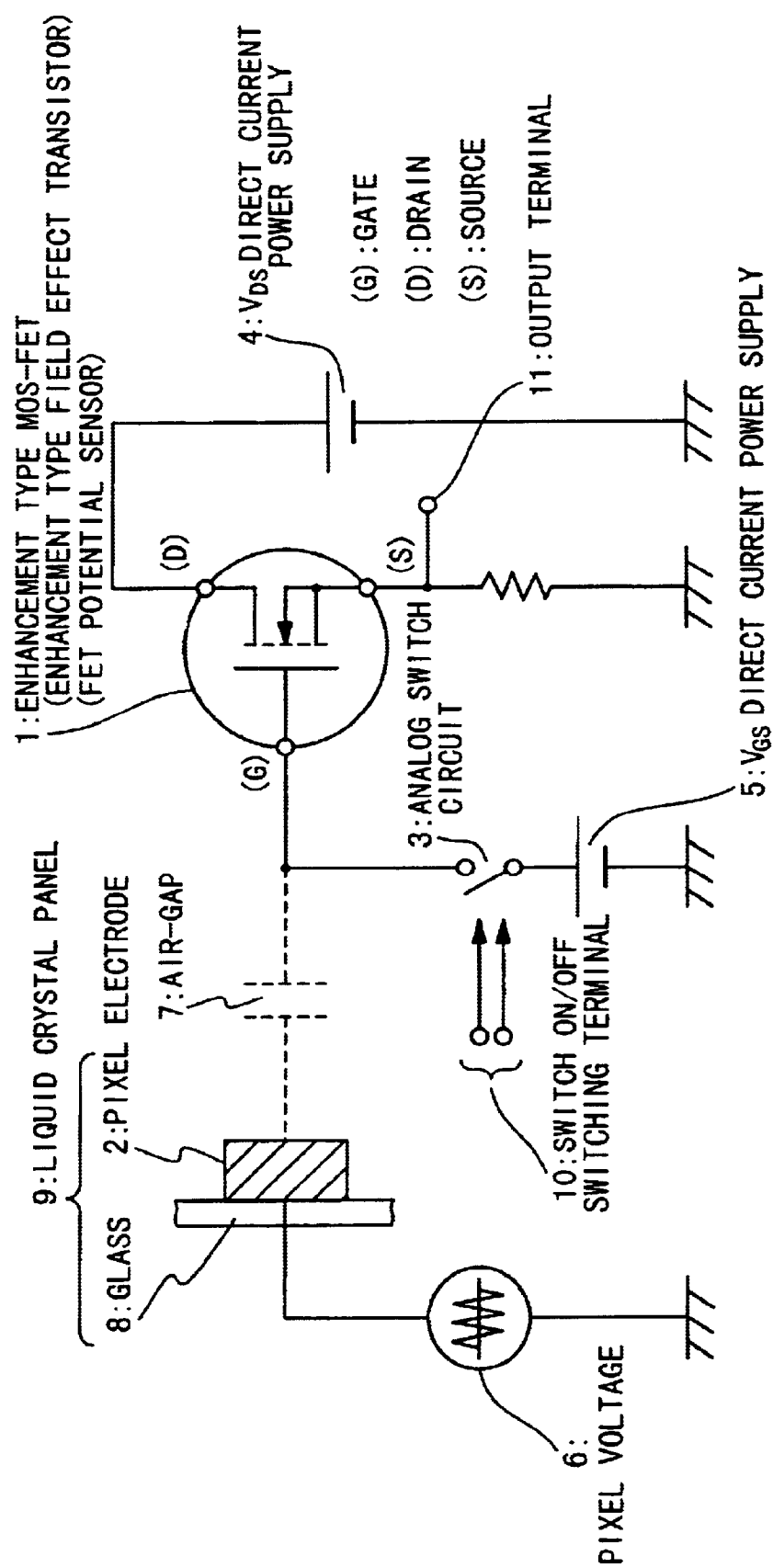
FIG. 2 is a circuit block of a potential sensor using a field effect transistor according to an embodiment of the present invention.
Figure 3:
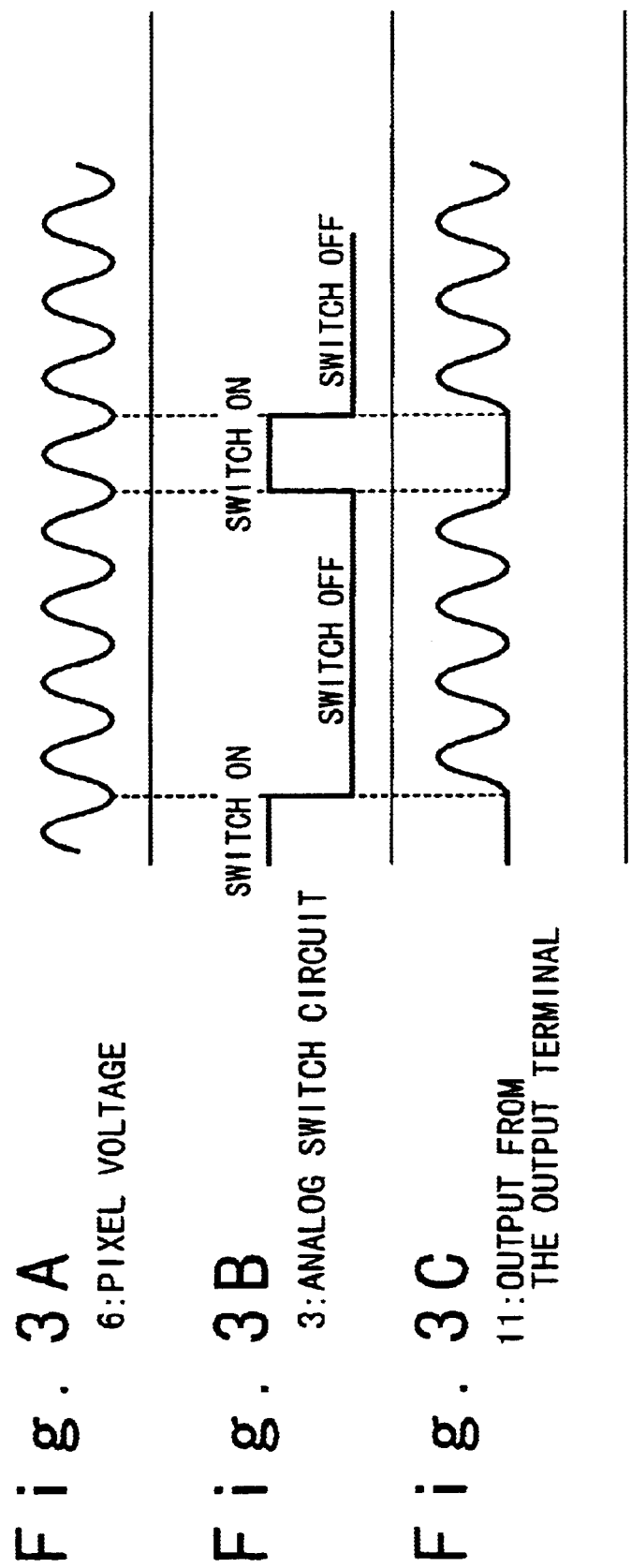
FIG. 3A is a view showing an alternating voltage signal applied to a pixel electrode of an inspection target, in an embodiment of the present invention.
FIG. 3B is a view showing an ON/OFF state of an analog switch, in an embodiment of the present invention.
FIG. 3C is a view showing a signal outputted from an output terminal of an enhancement type MOS-FET, in an embodiment of the present invention.
Figure 4:
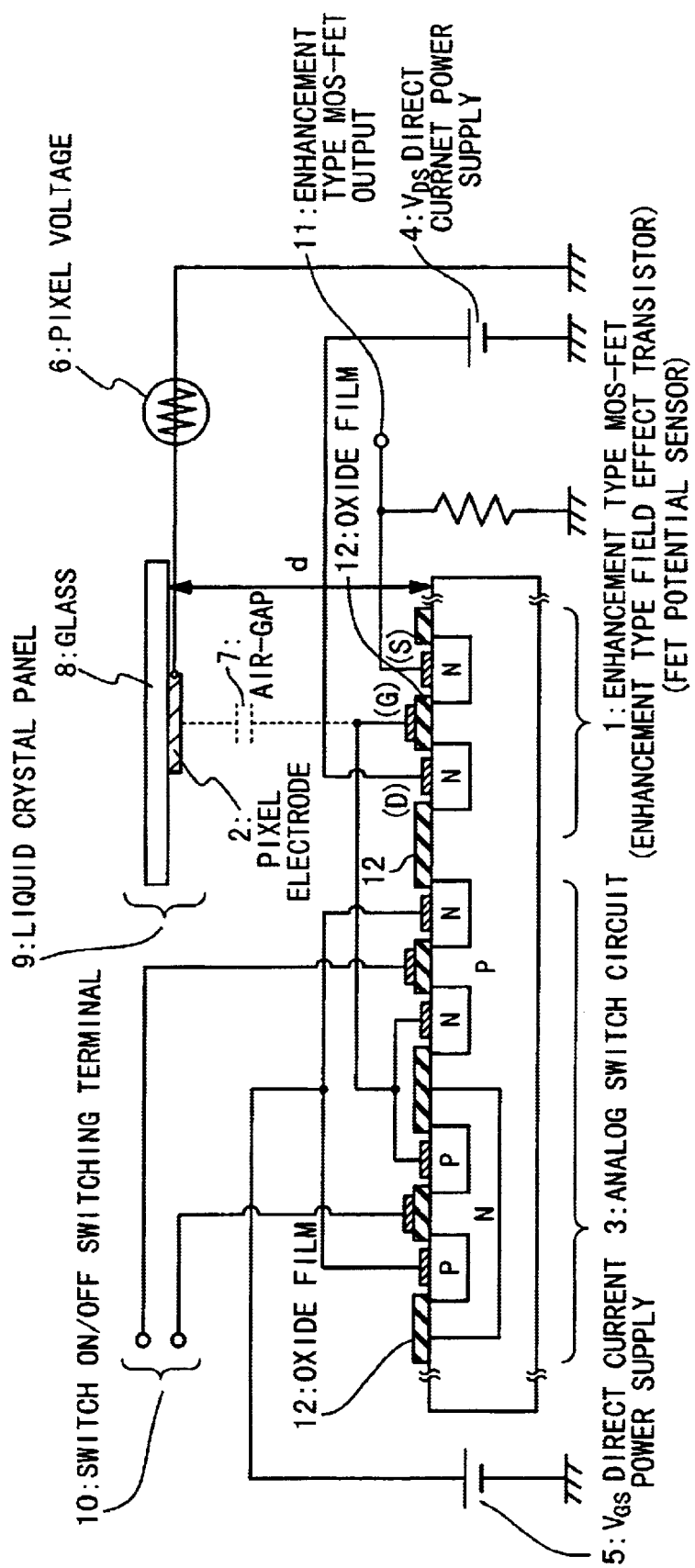
FIG. 4 is a section view showing a detection principle of a potential sensor according to an embodiment of the present invention.

FIG. 2 is a circuit block of a potential sensor using a field effect transistor according to an embodiment of the present invention. FIG. 3A is a timing chart showing an alternating voltage signal applied to a pixel electrode of an inspection target. FIG. 3B is a timing chart showing an ON/OFF state of an analog switch. FIG. 3C is a timing chart showing a signal outputted from an output terminal of an enhancement type MOS-FET. And, FIG. 4 is a section view showing the detection principle of the potential sensor using the field effect translator. By the way, the same symbols are given to the same members in FIGS. 2 to 4.

In FIG. 2, a gate (G) terminal of the enhancement type MOS-FET (enhancement type field effect transistor) (FET potential sensor) 1 is coupled or connected through an air-gap 7 to a pixel electrode 2 in a liquid crystal panel 9. Also, the gate (G) terminal of the enhancement type MOS-FET 1 is connected through an analog switch circuit 3 having a switch ON/OFF switching terminal 10 to a $V_{GS}$ (gate-bias) direct current power supply 5.

By the way, the liquid crystal panel 9 is provided with the pixel electrode 2 and a glass 8. A pixel voltage 6 is applied to the pixel electrode 2. Also, a $V_{DS}$ (drain voltage) direct current power supply 4 is connected to a drain (D) terminal of the enhancement type MOS-FET 1. An output terminal 11 of the enhancement type MOS-FET 1 is connected to a source (S) terminal of the enhancement type MOS-FET 1.

The potential sensor using the field effect transistor in this embodiment includes the enhancement type MOS-FET 1 and the analog switch circuit 3, as illustrated in the circuit shown in FIG. 2. So, the disconnection or the short-circuit of the pixel electrode 2 in the liquid crystal panel 9 of the inspection target is inspected by detecting the signal of the pixel voltage 6 when the analog switch circuit 3 is turned ON and OFF, in the enhancement type MOS-FET 1 through the air-gap 7.

The inspection principle of the liquid crystal panel will be described below with reference to FIGS. 2 and 4. The liquid crystal panel is inspected by using the potential sensor in which the enhancement type field effect transistor (FET) is applied. That is, the disconnection or the short-circuit of the pixel electrode 2 in the liquid crystal panel 9 is detected by the enhancement type MOS-FET 1 through the air-gap 7 by turning ON and OFF the analog switch circuit 3.

As shown in FIG. 4, there is an interval d of, for example, 20 μm between the liquid crystal panel 9 and the enhancement type MOS-FET 1. The enhancement type MOS-FET 1 inspects the disconnection or the short-circuit of the pixel electrode 2. Also, the pixel electrode 2 in the liquid crystal panel 9 is arrayed as pixels of, for example, 640×480.

By the way, the enhancement type MOS-FET 1 is the FET that is typically used. Its content is explained in "Analog Electronic Circuit in Integrated Circuit Era", by Nobuo Fujii, published by Shokodo K. K, Vol. 13, pp41–42, dated May 10, 1990. That is, a direct, current power supply $V_{GS}$ is applied between a gate (G) and a source (S) in a condition that the direct current power supply $V_{DS}$ is applied between a drain (D) and a source (S) of the FET. This causes a drain (D)-to-source (S) current $I_D$ to flow between them, and makes the enhancement type MOS-FET 1 active.

Here, the analog switch circuit 3 is turned ON by applying a positive direct current voltage (or, a negative direct current voltage) to the switch ON/OFF switching terminal 10 of the analog switch circuit 3. As a result, the $V_{GS}$ direct current power supply 5 is applied to the gate (G) portion of the enhancement type MOS-FET 1, and the FET 1 is made active.

At this time, the alternating voltage signal of the pixel voltage 6 applied to the pixel electrode 2 is sent, coupled or induced to the gate (G) portion of the enhancement type MOS-FET 1 through the air-gap 7. In this case, since the analog switch circuit 3 is at the ON-state, the pixel voltage 6 is passed through the analog switch circuit 3 and the $V_{GS}$ direct current power supply 5. Thus, as shown in FIGS. 3A to 3C, the pixel voltage 6 is not outputted to the output terminal 11 of the enhancement type MOS-FET 1. Hence, the operational flow is at a stage of preparing for a measurement, at the ON-state of the analog switch circuit 3.

Next, the analog switch circuit 3 is turned OFF by applying the negative direct current voltage (or, the positive direct current voltage) to the switch ON/OFF switching terminal 10 of the analog switch circuit 3.

At this time, the alternating voltage signal of the pixel voltage 6 applied to the pixel electrode 2 is sent to the gate (G) portion of the enhancement type MOS-FET 1 through the air-gap 7. Moreover, since the analog switch circuit 3 is at the OFF-state, the pixel voltage 6 is sent to the enhancement type MOS-FET 1. As shown in FIGS. 3A to 3C, the pixel voltage 6 is outputted to the output terminal 11 of the enhancement type MOS-FET 1.

However, since the analog switch circuit 3 is Originally at the OFF-state, the $V_{GS}$ direct current power supply 5 is not applied to the gate (G) portion of the enhancement type MOS-FET 1. For this reason, the FET 1 is not at the active state. Thus, the pixel voltage 6 should not be outputted to the output terminal 11 of the FET 1. However, the state of the switch in the analog switch circuit 3 is repeated such as ON, OFF, ON, OFF, . . . . Hence, the analog switch circuit 3 is always at the ON-state in the switch immediately before the switch of the analog switch circuit 3 is at the OFF-state.

Here, when attention is paid to the sectional structure of the gate (G) portion in the enhancement type MOS-FET 1 in FIG. 4, an oxide film 12 exists just beneath the gate (G). This is the feature of the MOS-FET. The enhancement type MOS-FET 1 is made active since the voltage (charge) of the $V_{GS}$ direct current power supply 5 is transiently accumulated in this oxide film 12.

Thus, when the switch of the analog switch circuit 3 is turned OFF from the ON-state, if a period of the OFF-state is short (about several milliseconds although it depends on the quality of the oxide film 12 itself), the enhancement type MOS-FET 1 is made active in a condition equal to the condition that the $V_{GS}$ direct current power supply 5 is applied to the gate (G) portion of the enhancement type MOS-FET 1 and in the condition that the analog switch circuit 3 is at a high impedance state since the switch is at the OFF-state). Thus, the signal of the pixel voltage 6 applied to the pixel electrode 2 is outputted to the output terminal 11 of the enhancement type MOS-FET 1 without any output to the analog switch circuit 3.

The above-mentioned method can inspect the disconnection or the short-circuit of the pixel electrode 2 at the high speed in the nor-contact condition by detecting the pixel voltage 6 applied to the pixel electrode 2 in the liquid crystal panel 9 and accordingly judging the detected signal.

The potential sensor in this embodiment is the potential sensor for detecting the voltage of the inspection target under the combination of the field effect transistor and the switching circuit. The gate-to-source voltage is applied to the gate terminal of the field effect transistor, at the ON-state, on the basis of the operation at which the switching circuit is turned ON or OFF. So, the field effect transistor is made active. Then, at the OFF-state, the switching circuit is made at the high impedance state, and the field effect transistor is made active.

By the way, the present invention is not limited to the above-mentioned embodiment. Various modifications may be made thereto, without departing from the spirit and scope of the invention.

The present invention can provide the potential sensor which detects the voltage of the inspection target at the non-contact condition to attain the higher speed of the inspection.

What is claimed is:

1. A potential sensor, comprising:
   a field effect transistor;
   a power supply configured to supply a direct current voltage to a gate electrode of said field effect transistor; and
   a switch configured to connect and disconnect said gate electrode to and from said power supply,
   wherein when said gate electrode is disconnected from said power supply, said field effect transistor is active, and
   wherein when said potential sensor is used, said gate electrode is configured to be coupled through an air-gap to an inspection target.

2. A potential sensor according to claim 1, wherein when said gate electrode is disconnected from said power supply, said field effect transistor is active with a charge included in an oxide film under said gate electrode.

3. A potential sensor according to claim 2, wherein said charge is charged in said oxide film when said gate electrode is connected to said power supply.

4. A potential sensor according to claim 1, wherein a voltage is applied to said inspection target.

5. A potential sensor according to claim 4, wherein when said gate electrode is connected to said power supply, said voltage applied to said inspection target is applied to said switching device not to be outputted in a source electrode of said field effect transistor.

6. A potential sensor according to claim 4, wherein when said gate electrode is disconnected from said power supply, said voltage applied to said inspection target is outputted in a source electrode of said field effect transistor not to be applied to said switching device.

7. A potential sensor according to claim 1, wherein said air-gap has an interval of approximately 20 μm.

8. A potential sensor according to claim 1, wherein said field effect transistor is an enhancement type MOS-FET.

9. A potential sensing method, comprising:
   (a) providing a field effect transistor;
   (b) providing a power supply supplying a direct current voltage to a gate electrode of said field effect transistor;
   (c) providing a switching device switching between connecting said gate electrode to said power supply and disconnecting said gate electrode from said power supply;
   (d) applying a voltage to an inspection target;
   (e) coupling said gate electrode through an air-gap to said inspection target;
   (f) connecting said gate electrode to said power supply;
   (g) disconnecting said gate electrode from said power supply after said (f); and
   (h) outputting said voltage applied to said inspection target from a source electrode of said field effect transistor while said (g) is performed.

10. A potential sensing method, according to claim 9, wherein said (f), (g) and (h) are performed repeatedly.

11. A potential sensing method according to claim 9, wherein when each of said (f) and (g) is performed, said field effect transistor is active.

12. A potential sensing method according to claim 9, wherein when said (f) is performed, a charge from said power supply is charged in an oxide film under said gate electrode.

13. A potential sensing method according to claim 12, wherein said when said (g) is performed, said field effect transistor is in action with said charge included in said oxide film.

14. A potential sensing method according to claim 9, wherein said (e) includes setting said air-gap to have an interval of approximately 20 μm.

15. A potential sensing method according to claim 9, wherein when said (f) is performed, said voltage applied to said inspection target is applied to said switching device not to be outputted from said source electrode.

16. A potential sensing method according to claim 9, wherein when said (g) is performed, said voltage applied to said inspection target is not applied to said switching device.

17. A potential sensing method according to claim 9, wherein said inspection target is a pixel electrode of a liquid crystal panel.

18. A potential sensing method according to claim 9, wherein said field effect transistor is an enhancement type MOS-FET.

19. A potential sensing method according to claim 9, wherein said (h) is performed in a condition that said gate electrode is not in physical contact with said inspection target.

20. A potential sensor, comprising:

a field effect transistor;

a power supply configured to supply a direct current voltage to a gate electrode of said field effect transistor; and a switch configured to connect and disconnect said gate electrode to and from said power supply, wherein when said gate electrode is disconnected from said power supply, said field effect transistor is active, and wherein a signal corresponding to a voltage of an inspection target is outputted from said gate electrode of said field effect transistor.

21. A potential sensor, comprising:

a field effect transistor;

a power supply configured to supply a direct current voltage to a gate electrode of said field effect transistor;

a switch configured to connect and disconnect said gate electrode to and from said power supply; and a target device configured to be monitored, wherein current flows between a drain and a source of said field effect transistor when said gate electrode is connected to said power supply and when said gate electrode is disconnected from said power supply, and wherein said potential sensor is connected to said target device through an air gap when said potential sensor is in use.

22. A potential sensor, comprising:

a field effect transistor;

a power supply configured to supply a direct current voltage to a gate electrode of said field effect transistor; and a switch configured to connect and disconnect said gate electrode to and from said power supply, and wherein when said gate electrode is disconnected from said power supply, current flows between a drain and a source of said field effect transistor.

23. The potential sensor according to claim 22, wherein when said gate electrode is disconnected from said power supply, said voltage applied to said target device is outputted in a source electrode of said field effect transistor and is not applied to said switch.

24. A potential sensing method, comprising:

applying a voltage to an inspection target;

coupling a gate electrode of a field effect transistor through an air gap to said inspection target;

connecting said gate electrode to a power supply configured to supply direct current voltage to said gate electrode using a switch;

disconnecting said gate electrode from said power supply using said switch;

outputting said voltage applied to said inspection target from a source of said field effect transistor while disconnecting said gate electrode from said power supply.

25. A potential sensing method, comprising:

Applying a voltage to an inspection target;

Coupling a gate electrode of a field effect transistor through an air gap to said inspection target;

Connecting said gate electrode to a power supply configured to supply direct current voltage to said gate electrode using a switch;

Disconnecting said gate electrode from said power supply using said switch;

Outputting said voltage applied to said inspection target from a source of said field effect transistor while disconnecting said gate electrode from said power supply, wherein when said disconnecting step is performed, said field effect transistor is active with said charge included in said oxide film.

* * * * *